(12) United States Patent
Obkircher et al.

(10) Patent No.: US 9,054,716 B2
(45) Date of Patent: Jun. 9, 2015

(54) APPARATUS AND METHODS FOR ADJUSTING PHASE-LOCKED LOOP GAIN

(71) Applicant: Skyworks Solutions, Inc., Woburn, MA (US)

(72) Inventors: Thomas Obkircher, Tustin, CA (US); Bipul Agarwal, Irvine, CA (US); Wei-Hong Chen, Tustin, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 36 days.

(21) Appl. No.: 13/887,771

(22) Filed: May 6, 2013

(65) Prior Publication Data

US 2013/0241612 A1 Sep. 19, 2013

Related U.S. Application Data

(63) Continuation of application No. 13/100,167, filed on May 3, 2011, now Pat. No. 8,456,244.

(51) Int. Cl.
*H03L 7/099* (2006.01)
*H03L 7/107* (2006.01)
*H03L 7/089* (2006.01)
*H03L 7/08* (2006.01)

(52) U.S. Cl.
CPC .............. *H03L 7/099* (2013.01); *H03L 7/1072* (2013.01); *H03L 7/0898* (2013.01); *H03L 7/08* (2013.01)

(58) Field of Classification Search
CPC ... H03L 7/1072; H03L 7/0898; H03L 7/0891; H03L 7/0895; H03L 2207/04; H03L 2207/05
USPC ........... 331/16, 17, 2; 327/147, 148, 156, 157
See application file for complete search history.

(56) References Cited

U.S. PATENT DOCUMENTS

| | | | |
|---|---|---|---|
| 5,625,325 A | | 4/1997 | Rotzoll et al. |
| 5,686,864 A | * | 11/1997 | Martin et al. ................. 331/1 A |
| 6,057,739 A | | 5/2000 | Crowley et al. |

(Continued)

FOREIGN PATENT DOCUMENTS

| | | |
|---|---|---|
| KR | 10-0519482 | 10/2005 |
| KR | 10-2006-0061917 | 6/2006 |

OTHER PUBLICATIONS

International Search Report and Written Opinion of Nov. 30, 2012 for corresponding PCT Application No. PCT/US2012/036022, filed May 1, 2012. 8 Pages.
Skyworks Solutions, Inc., "Basics of Dual Fractional-N Synthesizers/PLLs," May 17, 2005, 13 pages, available at: http://www.skyworksinc.com/uploads/documents/101463B.pdf (accessed Feb. 3, 2012).

(Continued)

*Primary Examiner* — Ryan Johnson
(74) *Attorney, Agent, or Firm* — Knobbe, Martens, Olson & Bear, LLP

(57) ABSTRACT

Apparatus and methods for adjusting a gain of an electronic oscillator, such as a voltage-controlled oscillator (VCO), are disclosed. In one aspect, an apparatus for compensating for VCO gain variations includes a charge pump controller. The charge pump controller can be configured to select a VCO gain model based on a comparison of a VCO gain indicator and a threshold value stored in a memory, obtain VCO gain model parameters from the memory corresponding to the selected VCO gain model, and compute a charge pump current control value using the VCO gain model parameters. The charge pump current control value can be used to compensate for VCO gain variations.

20 Claims, 7 Drawing Sheets

(56) References Cited

U.S. PATENT DOCUMENTS

| | | |
|---|---|---|
| 6,583,675 B2 | 6/2003 | Gomez |
| 6,987,409 B2 | 1/2006 | Kim et al. |
| 7,173,494 B2 | 2/2007 | Robinson et al. |
| 8,010,072 B1 | 8/2011 | Nathawad |
| 8,456,244 B2 * | 6/2013 | Obkircher et al. .............. 331/16 |
| 2007/0247235 A1 | 10/2007 | Gatta |
| 2009/0245450 A1 | 10/2009 | Miura et al. |

OTHER PUBLICATIONS

Skyworks Solutions, Inc., "Dual Fractional-N Synthesizers/PLLs," Oct. 7, 2005, 5 pages, available at: http://www.skyworksinc.com/uploads/documents/103037C.pdf (accessed Feb. 3, 2012).

Skyworks Solutions, Inc., "SKY72310: Spur-Free, 2.1 GHz Single Fractional-N Frequency Synthesizer," Jul. 30, 2008, 19 pages, available at: http://www.skyworksinc.com/uploads/documents/200705E.pdf (accessed Feb. 3, 2012).

* cited by examiner

APPARATUS AND METHODS FOR ADJUSTING PHASE-LOCKED LOOP GAIN

RELATED APPLICATION

This application is a continuation of U.S. patent application Ser. No. 13/100,167, filed May 3, 2011, titled "APPARATUS AND METHODS FOR ADJUSTING VOLTAGE CONTROLLED OSCILLATOR GAIN," the disclosure of which is hereby incorporated by reference in its entirety herein.

BACKGROUND

1. Field

The disclosed technology relates to electronic systems and, in particular, to voltage-controlled oscillators.

2. Description of the Related Art

Electronic parts, such as wide-band synthesizers, can support a wide range of output frequencies. To create a range of output frequencies, an electronic oscillator configured to oscillate within a range of frequencies, such as a voltage-controlled oscillator (VCO) can be used. In some applications, a wide range of output frequencies may be desired. For example, an output signal ranging from about 400 MHz to 6.3 GHz may be desired. To ensure high-performance within the entire frequency range, more than one VCO may be implemented. In such an implementation, each VCO may be dedicated to a specific frequency band, which may overlap with a frequency band of another VCO. Tuning the frequency of a VCO may impact the gain of the corresponding VCO. As frequency of a VCO is tuned and the corresponding gain is modified, this can lead to suboptimal performance. For systems that include a plurality of VCOs, compensating for changes in VCO gain can be more complicated. Accordingly, a need exists for improved systems and methods for compensate for VCO gain variation.

SUMMARY OF CERTAIN INVENTIVE ASPECTS

The methods and apparatus described in the claims each have several aspects, no single one of which is solely responsible for its desirable attributes. Without limiting the scope of this invention, some prominent features will now be briefly discussed.

One aspect of this disclosure is a method of adjusting a voltage-controlled oscillator (VCO) gain. The method includes selecting a VCO gain adjustment model based on a VCO gain indicator. The method also includes obtaining VCO gain adjustment model parameters from a memory. Using the VCO gain adjustment model parameters, a charge pump control value is computed. The overall loop gain of the phase-locked loop is dynamically adjusted using the charge pump control value.

According to some implementations, the VCO gain indicator is indicative of a VCO output frequency. In various implementations, the VCO gain indicator is indicative of a capacitance value in a tunable capacitance circuit configured to control a frequency of a VCO output. In some of these implementations, selecting the gain adjustment model includes comparing the capacitance value to a threshold value.

In accordance with a number of implementations, the gain adjustment parameters include a slope and an offset. In some implementations, obtaining VCO gain adjustment model parameters is based on a VCO selected from a plurality of VCOs.

In certain implementations, the method further includes computing the VCO gain model parameters, and storing the VCO gain model parameters to the memory.

Another aspect of this disclosure is an apparatus that includes a charge pump controller. The charge pump controller is configured to: select a VCO gain model based on a comparison of a VCO gain indicator and at least one threshold value stored in a memory; obtain VCO gain model parameters, from the memory, corresponding to the selected VCO gain model; and compute a charge pump control value using the VCO gain model parameters.

In some implementations, the VCO gain indicator is indicative of VCO output frequency. According to a number of implementations, the VCO gain indicator is indicative of a capacitance value in a circuit configured to control a VCO output frequency, and the threshold values stored in the memory represent threshold capacitance values. According to various implementations, the VCO gain model parameters correspond to a plurality of VCOs, and the charge pump controller is further configured to obtain VCO gain model parameters corresponding to one VCO selected from the plurality of VCOs. In some implementations, the VCO gain model parameters include at least a slope and an offset.

According to a number of implementations, the charge pump controller is configured to dynamically cause a gain of a VCO to be adjusted based on the charge pump current control value. In various implementations, the VCO gain model represents a portion of a VCO correction curve, the VCO correction curve representing the VCO output frequency indicator versus the charge pump current control value.

In accordance with some implementations, the apparatus further includes a phase-locked loop, the phase-locked loop including a VCO and a charge pump, the charge pump configured to: receive the charge pump current control value from the processor, and adjust a gain of the VCO based on the charge pump current control value.

According to certain implementations, the charge pump controller is further configured to compute the VCO gain model parameters and the at least one threshold value, and to store the VCO gain model parameters and the at least one threshold value to the memory. In some of these implementations, the charge pump controller is configured to compute the VCO gain model parameters in response to detecting a calibration event.

In certain implementations, the apparatus further includes the memory to store VCO gain model parameters and threshold values. In accordance with some of these implementations, the memory includes at least one look-up table to store at least one of the threshold values and the VCO gain model parameters.

Yet another aspect of this disclosure is an apparatus that includes: means for selecting a VCO gain model based on a comparison of a VCO gain indicator and at least one threshold value stored in a memory; means for obtaining VCO gain model parameters from the memory corresponding to the selected VCO gain model; and means for computing a charge pump current control value using the VCO gain model parameters.

In some implementations, the apparatus is a mobile device.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

Generally described, aspects of the present disclosure relate to adjusting a gain of an electronic oscillator, such as a voltage-controlled oscillator (VCO). For illustrative purposes, the description will be provided with reference to a VCO, although the principles and advantages may be applied to any electronic oscillator. A VCO may be part of a phase-locked loop (PLL), which may be included in a transmit and/or receive path of a mobile device, such as a cellular phone, or a base station. A gain of the VCO can be impacted by a number of factors, such as VCO output frequency and/or temperature. Yet, overall gain of a closed loop within a PLL can help to achieve best performance and/or stabilized loop bandwidth. Thus, compensating for factors that impact VCO gain can advantageously improve VCO performance, which in turn can also improve performance of any device that includes the VCO.

According to the disclosure provided herein, VCO gain can be dynamically compensated for such that the overall loop gain of a phase-locked loop is held substantially constant. This may include, for example, controlling a charge pump current based on an indicator of VCO gain, such as an indicator of VCO output frequency. A VCO gain correction curve can be partitioned into a plurality of VCO gain models. Depending on the VCO gain indicator, a particular VCO gain model can be selected. For implementations that include a plurality of individual VCOs, a VCO gain model can be chosen for the selected VCO. From the VCO gain model parameters and the indicator of VCO gain, a charge pump current value can be computed. The charge pump current value can then be used to adjust overall loop gain of the phase-locked loop.

The methods, apparatus, and computer readable media for compensating for VCO gain variations described herein may be able to achieve one or more of the following advantageous features, among others. First, an optimum charge pump current can be provided across an entire VCO output frequency range. Second, a charge pump controller can program a memory (e.g., a lookup table) only once, and may not need to compute and program the charge pump controller after each frequency change. Third, for architectures with multiple VCOs, the charge pump controller may not be required to read the active VCO in order to compute the charge pump current control value.

Figure 1:
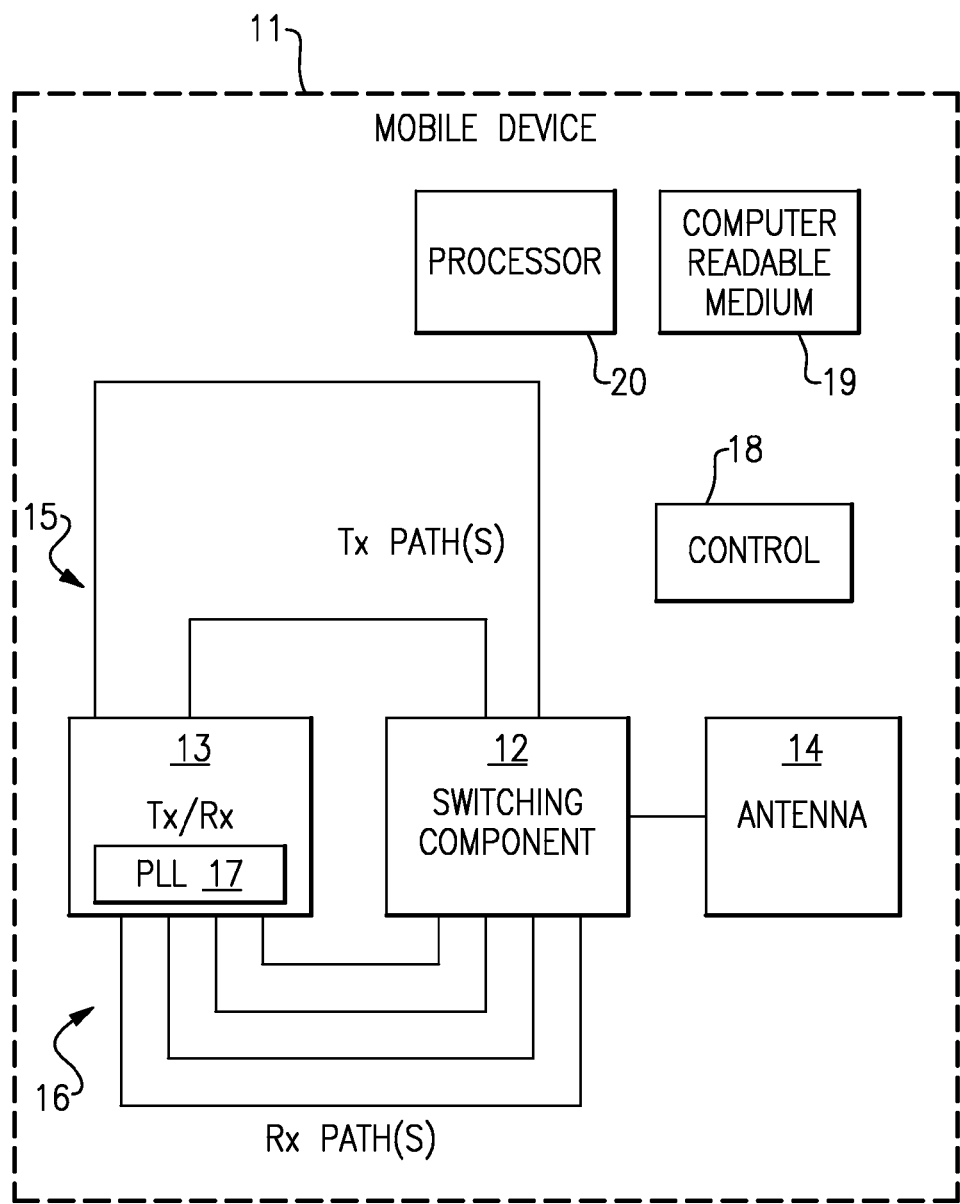
FIG. 1 schematically depicts a mobile device, which can include a phase-locked loop.

Any of the methods, apparatus, and computer readable media for adjusting VCO gain described herein can be implemented in a variety of electronic devices, such as a base station or a mobile device. FIG. 1 schematically depicts a mobile device 11. Examples of the mobile device 11 include, but are not limited to, a cellular phone (e.g., a smart phone), a laptop, a tablet computer, a personal digital assistant (PDA), an electronic book reader, and a portable digital media player. For instance, the mobile device 11 can be a multi-band and/or multi-mode device such as a multi-band/multi-mode mobile phone configured to communicate using, for example, Global System for Mobile (GSM), code division multiple access (CDMA), 3G, 4G, and/or long term evolution (LTE).

The mobile device 11 can include a transceiver component 13 configured to generate RF signals for transmission via an antenna 14, and receive incoming RF signals from the antenna 14. The transceiver 13 can also include one or more phase-locked loops (PLLs) 17 in a receive and/or a transmission path. Each PLL 17 can each include one or more VCOs configured to generate output signals within a frequency band. The PLL 17 can be used, for example, in up-converting a signal in a transmit path and/or down-converting a signal in receive path. Although the example phase-locked loop 17 is illustrated in the context of a transceiver 13, any component of a phase-locked loop described herein can be implemented in a receiver, transmitter, and/or other electronic systems with a need for a voltage-controlled oscillator.

One or more output signals from the transceiver 13 can be provided to the switching component 12 using one or more transmission paths 15, which can be output paths associated with different bands and/or different power outputs, such as amplifications associated with different power output configurations (e.g., low power output and high power output) and/or amplifications associated with different bands. Additionally, the transceiver 13 can receive signal from the switching component 12 using one or more receiving paths 16.

The switching component 12 can provide a number of switching functionalities associated with an operation of the wireless device 11, including, for example, switching between different bands, switching between different power modes, switching between transmission and receiving modes, or some combination thereof. However, in certain implementations, the switching component 12 can be omitted. For example, the mobile device 11 can include a separate antenna for each transmission and/or receiving path.

In certain embodiments, a control component 18 can be included and configured to provide various control functionalities associated with operations of the switching component 12, the power amplifiers 17, and/or other operating component(s). Additionally, the mobile device 11 can include a processor 20 for facilitating implementation of various processes. The processor 20 can be configured to operate using instructions stored on a non-transitory computer-readable medium 19. The processor 20 can implement any combination of features of the transceiver 13.

Figure 2:
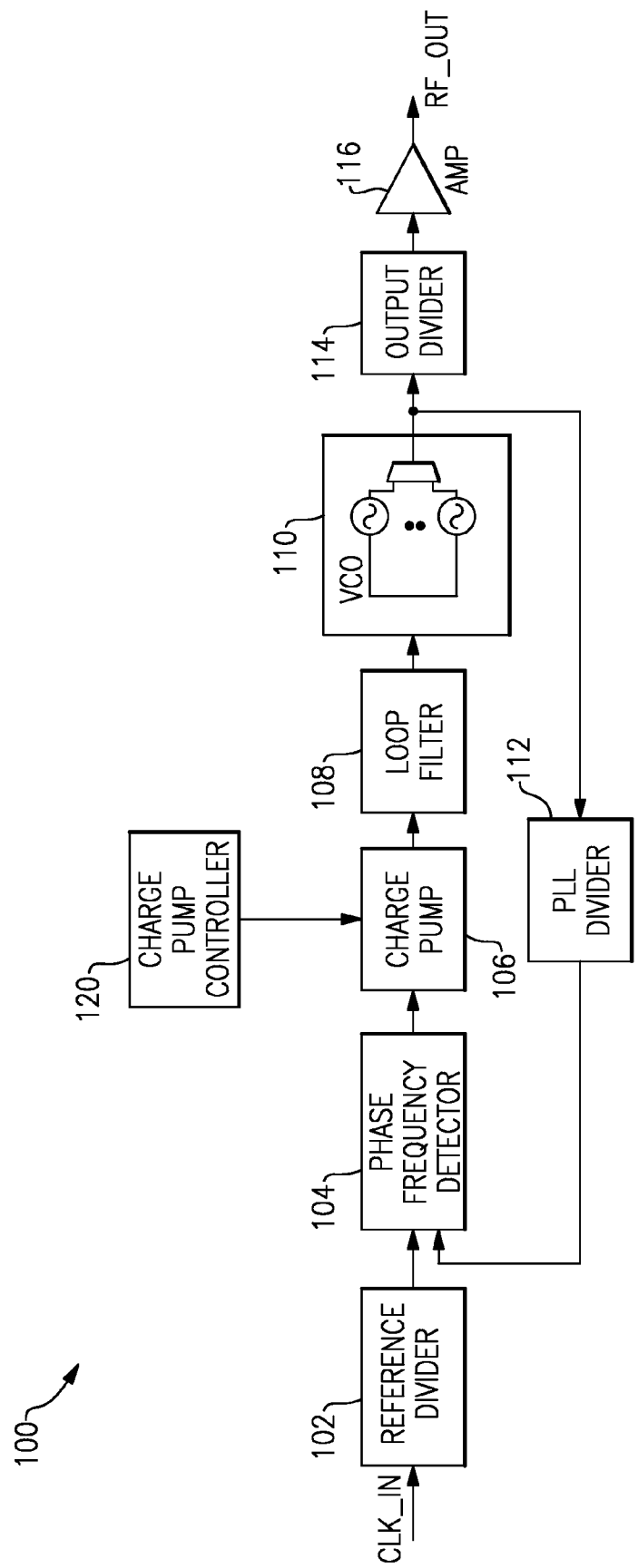
FIG. 2 schematically illustrates a phase-locked loop, according to one embodiment.

FIG. 2 schematically illustrates an example phase-locked loop 100. A phase-locked loop (PLL) can be a closed-loop, frequency-control system based on the phase difference between an input reference signal (e.g., an input clock) and a feedback signal (e.g. a feedback clock) of a controlled oscillator. The PLL can generate an output signal having a phase related to the phase of the input reference signal. The PLL can be implemented by electronic circuits. As illustrated, the phase-locked loop 100 includes a reference divider 102, a phase frequency detector 104, a charge pump 106, a loop filter 108, a VCO 110, a PLL divider 112, an output divider 114, and an output amplifier 116. A charge pump controller 120 can also be included. It will be understood that fewer or greater components may implement a PLL. For example, in some instances the reference divider 102, the output divider 114, and the output amplifier 116 may not be included.

The reference divider 102 can receive an input clock and generate a reference clock signal having a frequency of the input clock divided by M. The phase frequency detector 104 can receive the reference clock signal and align an edge of the reference clock (e.g., a rising edge) to the feedback clock generated by the PLL divider 112. The PLL divider 112 can generate the feedback clock from the VCO output. The feedback clock can have a frequency of the frequency of VCO divided by N. The phase frequency detector 104 can detect a relative difference in phase and frequency between the reference clock and the feedback clock.

Based on whether the feedback clock frequency is lagging or leading the reference frequency, the phase frequency detector can provide control signal(s) to control the charge pump 106 that indicate that the VCO 110 should operate at a higher or a lower frequency. However, when the feedback clock and the reference clocks are aligned, the VCO frequency may remain the same. If the charge pump 106 receives an indicator that the frequency of VCO should be increase, current can be driven into the loop filter 108. Conversely, if the charge pump 106 receives an indicator that the frequency of VCO should be decreased, current can be drawn from the loop filter 108. Additionally, the charge pump 106 can generate a VCO gain adjustment indicator, which can be used to adjust a gain of the VCO output to the VCO 110 via the loop filter 108. The gain of the VCO output can be adjusted while maintaining a constant VCO output frequency.

The loop filter 108 can generate a control voltage based on one or more signals from the charge pump 106. The control voltage can be used to bias the VCO 110. Based on the control voltage, the VCO 110 can oscillate at a higher or lower frequency, which can affect the phase and frequency of the feedback clock. The VCO 110 can stabilize once the reference clock and the feedback clock have substantially the same phase and frequency. The loop filter 108 can filter out jitter by removing glitches from the charge pump 106, thereby preventing voltage over-shoot.

In some implementations, the VCO 110 can include a plurality of individual VCOs. For instance, in some implementations, 2 to 8 VCOs may be included in VCO 110. In implementations with a plurality of VCOs, each of the plurality of VCOs can generate an output within a specific frequency band that overlaps with a corresponding frequency band of another VCO. With a plurality of VCOs, one individual VCO of the VCO 110 can be selected to generate the VCO output, based on the desired output frequency. In this way, a wide range of output frequencies can be generated with high-performance within the entire range of VCO output frequencies.

The VCO output can be provided to the PLL divider 112 and the output divider 114. The output divider 114 can generate an output divider clock having an output divider signal that is less than the VCO output frequency. The output amplifier 116 can receive the output divider clock and provide an amplified output signal.

Additionally, the PLL 100 includes a charge pump controller 120. Any combination of the features of any of the charge pump controllers described herein may be implemented on a processor, for example, the processor 20 of FIG. 1. In some instances, a processor that includes the PLL 100 and a charge pump controller 120 can be a synthesizer, such as a wide-band synthesizer. The charge pump controller 120 may be implemented on either the same integrated circuit or a separate integrated circuit from one or more of the other illustrated components of the PLL 100. Moreover, the charge pump controller 120 can be implemented using any suitable combination of analog and/or digital circuitry.

The charge pump controller 120 can provide a charge pump current control value to the charge pump 106, which can be used to compensate for a VCO gain variation $K_v$. For example, based on the charge pump current control value, the charge pump 106 can send a VCO gain adjustment indicator to adjust a gain of the VCO output to the VCO 110 via the loop filter 108. The VCO gain adjustment indicator can then adjust the gain of the VCO output without changing VCO output frequency. In some instances, the VCO gain adjustment indicator can control the charge pump current by switching in one or more capacitive circuit elements in parallel with the charge-pump output, which can affect an overall loop gain. More details regarding the charge pump controller 120 will be provided later with reference to FIGS. 4-6.

Figure 3A:
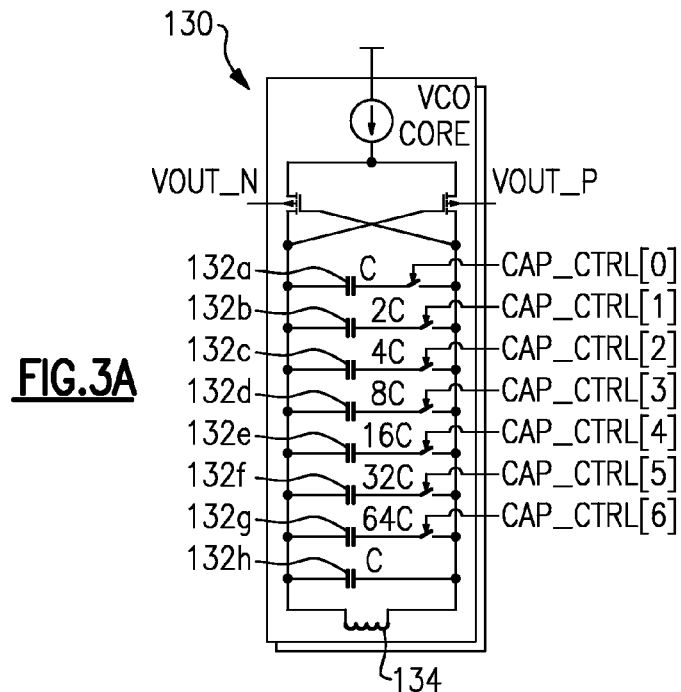
FIG. 3A shows an example circuit that can control voltage-controlled oscillator (VCO) frequency.

The VCO gain $K_v$ can vary based on a parameter indicative of VCO frequency. For example, a parameter used to control VCO frequency can also be indicative of the VCO gain $K_v$. FIG. 3A provides an example circuit that can control VCO frequency. In particular, FIG. 3A illustrates a tunable capacitance circuit 130 that can adjust VCO output frequency. In implementations in which a PLL includes a plurality of individual VCOs, a separate tunable capacitance circuit 130 can be used for each VCO. Although capacitance of a tunable capacitance circuit is described as an example parameter that is indicative of VCO gain, other parameters can alternatively or additionally be used as an indicator of VCO gain and/or VCO output frequency.

The tunable capacitance circuit 130 can include a plurality of capacitors 132a-132h and an inductor 134 that can form an LC tank. Effective capacitance of the LC tank can be adjusted using capacitance control signals that can add and/or remove additional capacitance from the effective capacitance, which can represent the combined capacitance of the tunable capacitance elements that are part of the LC tank circuit. For instance, each capacitor 132a-132g of the LC circuit shown in FIG. 3A can be selectively included or excluded from the effective capacitance of the LC tank based on values of the capacitance control signals CAP_CTRL[0:6] opening and/or closing switches, such as transistors. With additional capacitance, the VCO frequency can decrease. Conversely, with reduced capacitance, the VCO frequency can increase. The resonant frequency ω of the VCO can be proportional to the reciprocal of the square root of the inductance L times the capacitance C, for example, as represented by the following equation:

$$\omega = \frac{1}{\sqrt{L*C}}.$$

Figure 3B:
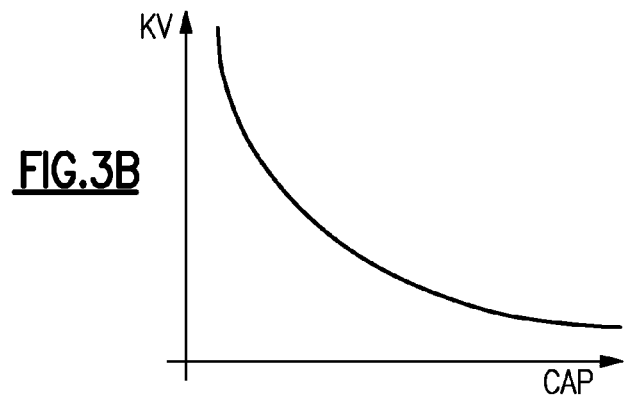
FIG. 3B illustrates a relationship between gain and capacitance in a VCO controlled by the example tunable capacitance circuit shown in FIG. 3A.

FIG. 3B illustrates a relationship between VCO gain $K_v$ and effective capacitance in the example tunable capacitance circuit shown in FIG. 3A. As shown in FIG. 3B, the VCO gain $K_v$ can have an inverse logarithmic relationship with effective capacitance of the tunable capacitance circuit. As effective capacitance increases, a decrease in VCO gain $K_v$ has been observed in an inverse logarithmic relationship.

Figure 3C:
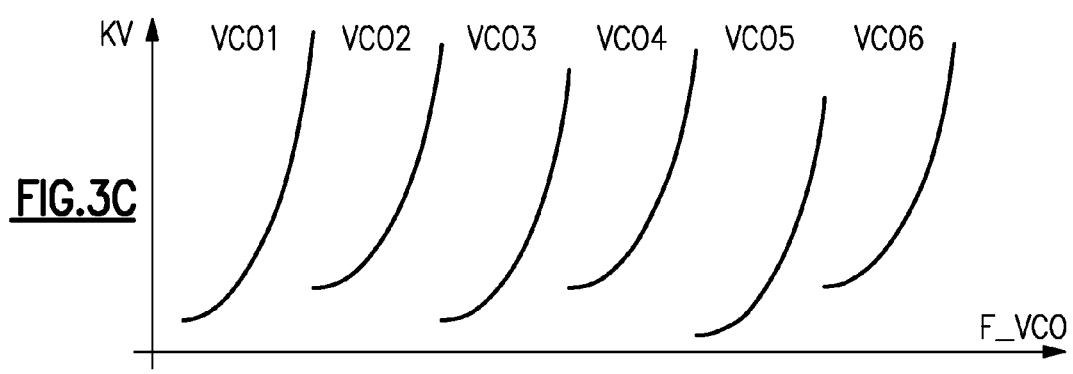
FIG. 3C illustrates the relationship between gain and frequency in a synthesizer having a plurality of VCOs.

Additionally, in implementations with a plurality of VCOs, a VCO gain $K_v$ vs. VCO frequency curve can include a plurality of sections corresponding to each VCO. Each of the plurality of sections can have a similar shape and represent a similar relationship between VCO gain $K_v$ and VCO frequency. FIG. 3C illustrates an example of the relationship between VCO gain $K_v$ and VCO frequency in a synthesizer having a plurality of VCOs. As shown in FIG. 3C, a portion of the $K_v$ vs. VCO frequency curve corresponding to each VCO can illustrate a similar relationship. However, a corresponding slope and offset (which can also be referred to as an "intercept") for each individual VCO may differ. This can be due to differences in VCO architectures.

In order to improve performance and/or stabilize loop bandwidth, overall loop gain can advantageously be kept substantially constant. One way to keep overall loop gain constant is to compensate for VCO gain variation. This can be accomplished, for example, by adjusting the current in the charge pump (e.g., charge pump 106 of FIG. 2) of the phase-locked loop using a charge pump controller (e.g., charge pump controller 120 of FIG. 2).

Figure 4:
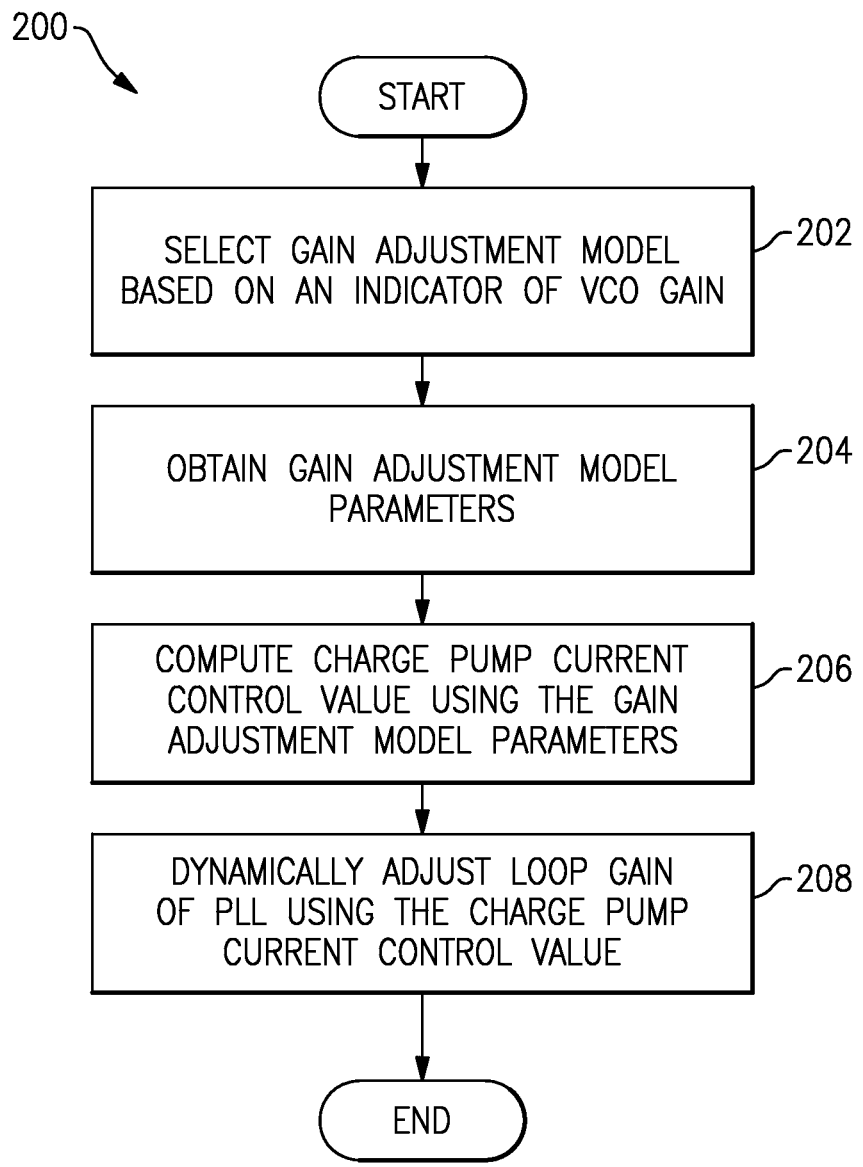
FIG. 4 is a flowchart of an illustrative method of compensating for VCO gain variation, according to one embodiment.

FIG. 4 is a flowchart of an illustrative method 200 of compensating for VCO gain variations. Any combination of the features of the method 200 may be embodied in a non-transitory computer readable medium and stored in non-volatile memory. When executed, the non-transitory computer readable medium may cause some or all of the method 200 to be performed. It will be understood that any of the methods discussed herein may include greater or fewer operations and the operations may be performed in any order, as appropriate.

The method 200 can adjust the VCO gain so as to stabilize the overall loop gain of the phase-locked loop as any factor that can impact VCO gain changes. One example of a factor that can impact VCO gain is VCO out frequency as shown in FIG. 3C. Although more detail will be provided with reference to VCO output frequency for illustrative purposes, other factors can be used as indicators of VCO gain in accordance with the methods and systems described herein. For example, VCO gain can depend on temperature and overall loop gain of the phase-locked loop can be adjusted to account for changes in temperature, for example, as determined via a temperature sensor.

By performing the method 200, the overall loop gain of the phase-locked loop can be adjusted in parts that have not undergone factory calibration related to charge pump current for factors that can impact VCO gain, such as VCO output frequency ranges. In addition, the method 200 does not require additional programming related to factory calibration by a controller prior to activation. Moreover, in compensating for an impact on VCO gain due to VCO output frequency, when the method 200 is performed in a PLL having a plurality of VCOs, a controller may not need to obtain additional information regarding which VCO is selected in the case where the VCO frequency is in an overlapping frequency range in which more than one VCO can generate the VCO frequency.

A VCO gain adjustment model can be selected based on an indicator of VCO gain at block 202. The VCO gain indicator can be indicative of any factor that can impact VCO gain, including, among other things, VCO output frequency and/or temperature. Since the VCO gain can be dependent on an indicator of VCO frequency (e.g., as shown in FIG. 3B), a charge pump controller can adjust the charge pump current to compensate for the change in VCO gain due to the change in the indicator of VCO frequency. In some instances, the indicator of VCO frequency can be an effective capacitance in a tunable capacitance circuit for controlling VCO frequency.

A VCO gain correction curve can correct for the variation of VCO gain based on the indicator of VCO output frequency or other indicators that VCO gain may be changing. Thus, a value on the VCO gain correction curve can be provided to a charge pump controller to cause the charge pump to compensate for the impact of VCO frequency on the VCO gain. Although the VCO gain correction curve corresponding to a VCO may not be linear, the VCO gain correction curve may be divided into a plurality of piecewise linear gain adjustment models. Each of these models may correspond to a range of frequency indicator values. Accordingly, the VCO gain adjustment model can be selected based on a comparison of the indicator of VCO frequency to one or more thresholds, which can represent values that divide the VCO gain correction curve into separate linear gain adjustment models. In some implementations with multiple VCOs, the thresholds may be selected such that they are the same for each separate VCO.

The VCO gain adjustment models can include gain adjustment model parameters. VCO gain adjustment model parameters can be obtained at block 204. The model parameters can be any parameters from which a gain adjustment model can be created. For instance, the model parameters can include a slope and an intercept for a linear gain adjustment model. The gain model parameters can be stored in memory and obtained by a read from memory. In implementations with multiple VCOs, the gain model parameters can be obtained for the VCO selected to generate the VCO output. For example, the gain model parameters corresponding to each VCO can be accessed from memory, and the gain model parameters for the selected VCO can be obtained using logic to select the gain model parameters for the selected VCO.

Using the gain adjustment model parameters, a charge pump current control value can be computed at block 206. For example, using the VCO frequency indicator, the charge pump current control value may be based on the slope times the frequency indicator plus the offset for a linear gain adjustment model. The charge pump current control value can then be provided to a charge pump that controls the overall loop gain of the phase-locked loop.

The overall loop gain of the phase-locked loop can be dynamically adjusted using the charge pump current control value at block 208. The charge pump can compensate for VCO gain variations without substantially modifying the VCO frequency. In this way, the overall loop gain of the phase-locked loop can be stabilized. As a result, the PLL can operate with better performance and/or with stabilized loop bandwidth.

Figure 5:
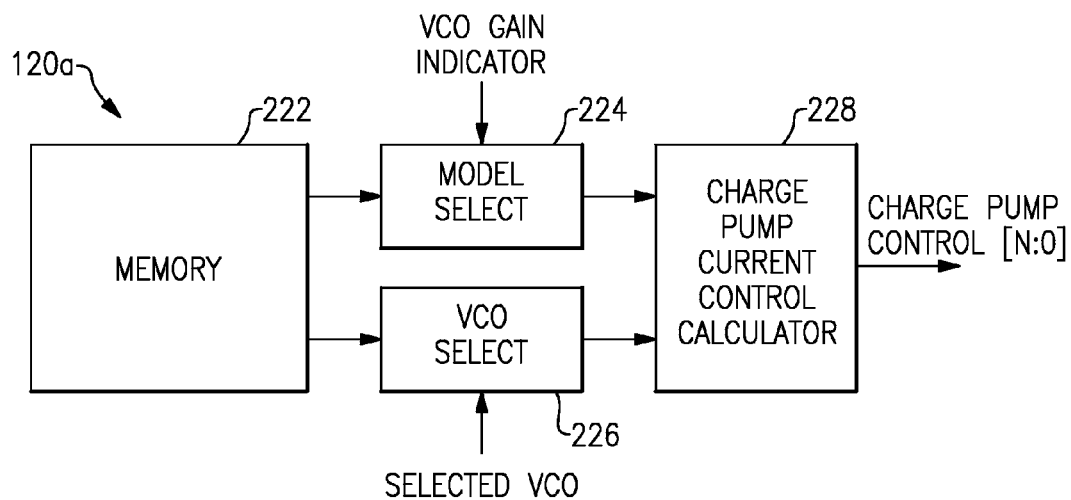
FIG. 5 is a block diagram of a circuit that can compensate for VCO gain variation, according to an embodiment.

FIG. 5 is a block diagram of a charge pump controller 120*a*, which is one example of the charge pump controller 120 of FIG. 2. The charge pump controller 120*a* can be included in a processor, such as a synthesizer. In some instances, the processor can include a PLL that includes the charge pump controlled by the charge pump controller 120*a*. The charge pump controller 120*a* can compensate for VCO gain variations, for example, according to any combination of features of the method 200. The charge pump controller 120 can include a memory 222, a model select block 224, a VCO select block 226, and a charge pump current control calculator 228. The charge pump controller 120 can control VCO gain based on any indictor of VCO gain, for example, an indicator of the VCO output frequency. In implementations with a plurality of VCOs, the charge pump controller 120*a* can also control the overall loop gain of the phase-locked loop based on the selected VCO.

The memory 222 can include RAM memory, flash memory, ROM memory, EPROM memory, EEPROM memory, registers, hard disk, a removable disk, a CD-ROM, or any other form of storage medium known in the art. The memory 222 can store threshold values and gain adjustment model parameters. In some instances, the memory can include one or more lookup tables. In this way, the thresholds and gain adjustment model parameters can be stored locally in the charge pump controller 120a so that these values do not need to be derived and/or retrieved from a remote memory each time these values are used.

The model select 224 can select a portion of a VCO gain correction curve based on VCO frequency. The model select 224 can obtain one or more threshold values from the memory 224 and an indicator of VCO gain, such as VCO output frequency, from the VCO. Then the model select 224 can compare the indicator of VCO gain to the one or more threshold values. From the comparison(s), a VCO gain adjustment model representing a portion of the VCO gain correction curve can be selected. The selected VCO gain adjustment model can correspond, for example, to the VCO output frequency. The model select 224 can provide the charge pump current control calculator 228 with a model select indicator that indicates which VCO gain adjustment model to use to modify overall loop gain of the phase-locked loop based on the VCO gain indictor. For instance, the gain adjustment model can be selected based on a particular VCO output frequency.

The VCO select 226 can select one of a plurality of individual VCOs. For instance, a plurality of VCOs may be used to generate output signals spanning a wide range of output frequencies, in which each individual VCO generates an output signal for a portion of the output frequency range. The VCO select 226 can obtain VCO gain adjustment model parameters corresponding to a plurality of VCOs from the memory 224. The gain adjustment parameters can include, for example, a slope and an offset. The VCO select 226 can also obtain an indicator of the selected VCO from the VCO. The indicator of the selected VCO can indicate which of the plurality of VCOs is used to generate a VCO output at the VCO frequency. Based on the indicator of the selected VCO, the VCO select 226 can provide the charge pump current control calculator 228 with VCO gain adjustment parameters corresponding to the selected VCO.

The charge pump current control calculator 228 can compute a charge pump current control value based on the model select indicator from the model select 224 and the VCO gain adjustment parameters from the VCO select 226. Using this data, the charge pump current control calculator 228 can dynamically calculate the charge pump current control value for the selected VCO at a particular frequency. Using the charge pump current control value, the charge pump of the PLL (e.g., the charge pump 106 of FIG. 3), can compensate for VCO gain variations so as to stabilize the overall loop gain of the PLL.

Figure 6:
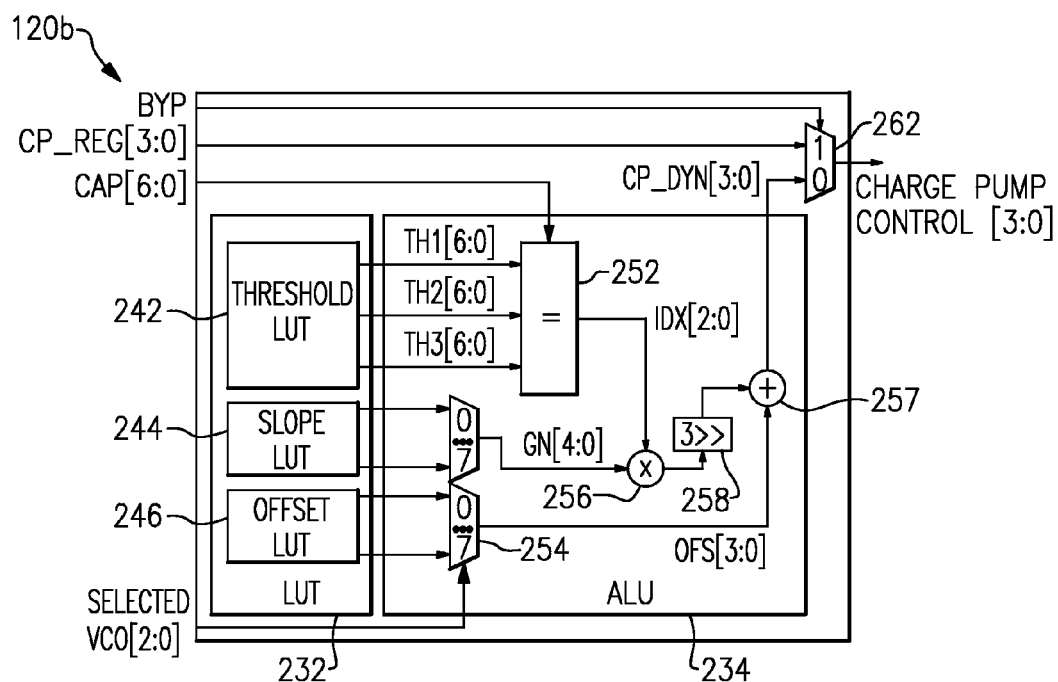
FIG. 6 schematically illustrates a circuit that can compensate for VCO gain variation, according to another embodiment.

FIG. 6 schematically illustrates a charge pump controller 120b that can dynamically adjust for VCO gain variations. The charge pump controller 120b is another example of the charge pump controller 120 of FIG. 2, which can be implemented in a processor, such as a synthesizer. In some instances, the charge pump controller 120b may also correspond to the charge pump controller 120a. The charge pump controller 120b can include a lookup table component 232 and an arithmetic logic unit 234.

As illustrated, the lookup table component 232 includes three lookup tables: a threshold lookup table 242, a slope lookup table 244, and an offset lookup table 246. Since the amount of data and/or the length of data entries may be different, each of the lookup tables 242, 244, and 246 may be of different sizes. Alternatively, these three lookup tables can also be implemented by any number of lookup tables. In some instances, the lookup table component 232 can also store addition information for each VCO, including, for example, maximum VCO output frequency, minimum output frequency, maximum VCO gain, minimum VCO gain, and/or charge pump current control value range. Table 1 provides an example of some of the values that can be stored in the lookup table component 232.

TABLE 1

| Threshold | | | | | | |
|---|---|---|---|---|---|---|
| TH1 | TH2 | TH3 | TH4 | TH5 | TH6 | TH7 |
| 18 | 35 | 51 | 67 | 83 | 98 | 113 |

| VCO | 1 | 2 | 3 | 4 | 5 | 6 |
|---|---|---|---|---|---|---|
| Slope | | | | | | |
| x < TH1 | 0.875 | 0.625 | 1.125 | 1.625 | 1.125 | 1.75 |
| TH1 <= x < TH2 | 0.9 | 0.7 | 1.2 | 1.7 | 1.3 | 2.05 |
| TH2 <= x < TH3 | 0.95 | 0.8 | 1.3 | 1.8 | 1.5 | 2.375 |
| TH3 <= x < TH4 | 1.1 | 0.925 | 1.45 | 1.925 | 1.75 | 2.75 |
| TH4 <= x < TH5 | 1.25 | 1.1 | 1.6 | 2.1 | 2.1 | 3.15 |
| TH5 <= x < TH6 | 1.5 | 1.325 | 1.75 | 2.3 | 2.7 | 3.5 |
| TH6 <= x < TH7 | 1.9 | 1.5 | 2.05 | 2.8 | 3.35 | 4.1 |
| TH7 <= x | 2.5 | 1.85 | 2.3 | 3.3 | 4.0 | 4.8 |
| Offset | | | | | | |
| x < TH1 | 1.25 | 1.25 | 1 | 1.75 | 1.5 | 2.25 |
| TH1 <= x < TH2 | 1.51 | 1.44 | 1.34 | 2.24 | 1.84 | 2.78 |
| TH2 <= x < TH3 | 1.78 | 1.65 | 1.70 | 2.75 | 2.23 | 3.39 |
| TH3 <= x < TH4 | 2.02 | 1.85 | 2.02 | 3.20 | 2.60 | 3.98 |
| TH4 <= x < TH5 | 2.24 | 2.03 | 2.31 | 3.58 | 2.95 | 4.53 |
| TH5 <= x < TH6 | 2.43 | 2.20 | 2.55 | 3.90 | 3.27 | 5.01 |
| TH6 <= x < TH7 | 2.58 | 2.33 | 2.73 | 4.13 | 3.54 | 5.36 |
| TH7 <= x | 2.73 | 2.45 | 2.89 | 4.35 | 3.81 | 5.68 |

Figure 7:
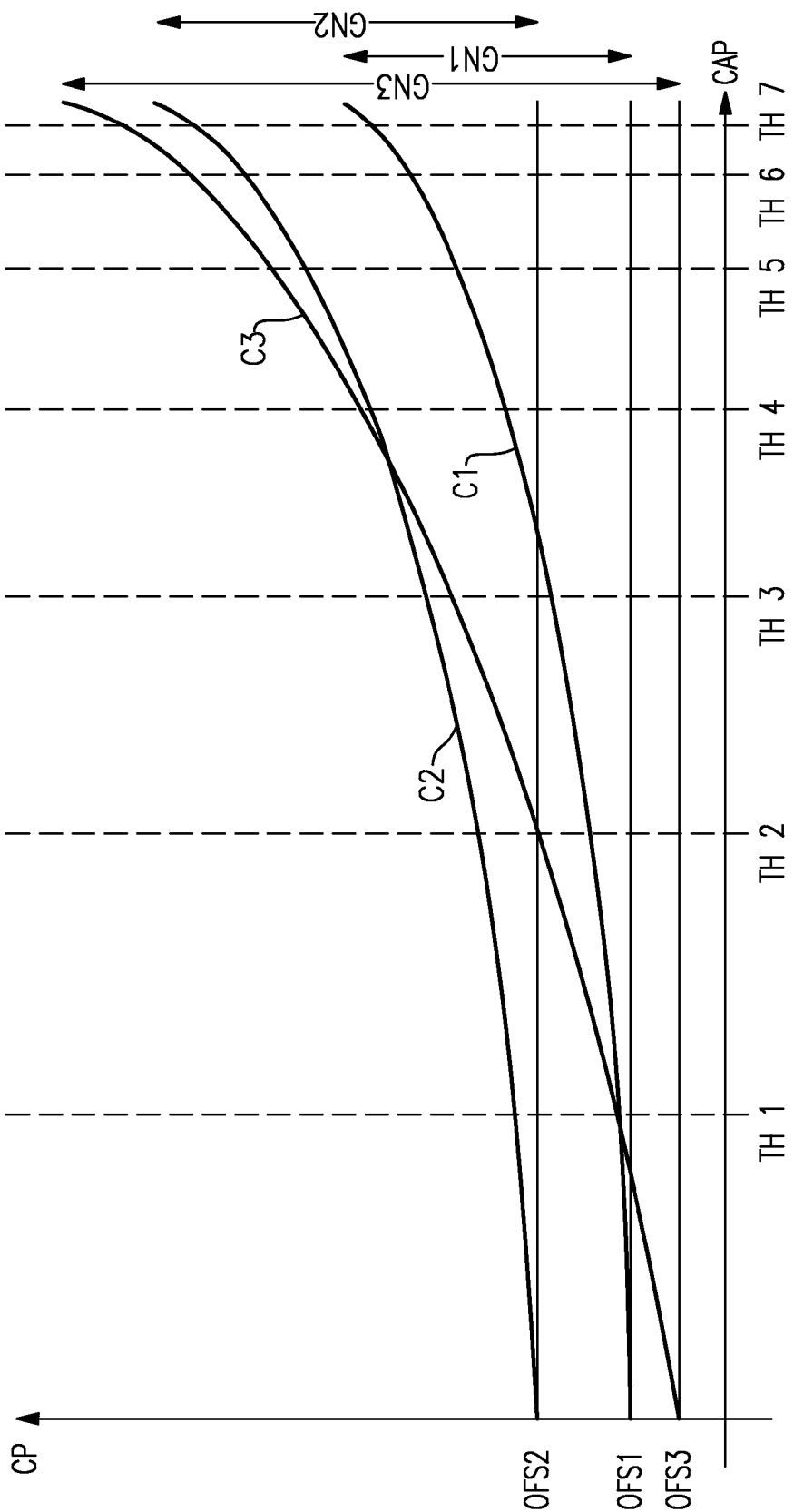
FIG. 7 is a plot of example VCO correction curves.

The values stored in the lookup table component 232 can provide all of the data to calculate a charge pump current control value based on an indicator of VCO gain (e.g., an indicator of VCO frequency) and an indicator of the selected VCO. Some or all of the values stored in the lookup table component 232 can correspond to, for example, a piecewise linear representation of the VCO gain correction curves illustrated in FIG. 7. The VCO gain correction curves C1, C2, and C3 of FIG. 7 can correspond to charge pump current control values that can be used to keep the overall loop gain of the phase-locked loop substantially constant for different capacitance values in the tunable capacitance circuit used to generate a VCO output signal. While three VCO gain correction curves are shown in FIG. 7, one VCO gain correction curve can be determined for each VCO in a PLL. More detail regarding an example of obtaining the values in the lookup table component 232 will be provided with reference to FIG. 8.

The threshold values TH1-TH7 of FIG. 7 can be determined such that a portion of each VCO gain correction curve C1-C3 can be represented by a linear function. Accordingly, for portions of a VCO gain correction curve with a steeper slope, the thresholds may be closer together. For example, there is less difference between thresholds TH7 and TH6 than between thresholds TH1 and TH2. In addition, there may be one less threshold than the number of linear partitions of the VCO gain correction curve, since n thresholds can divide a curve into n+1 partitions. For instance, 7 threshold values can be used to divide a VCO gain correction curve into 8 linear partitions. The same threshold values TH1-TH7 may be used for each VCO gain correction curve. The thresholds can be indicative of VCO frequency. For instance, in the example implementations of FIGS. 5-6, the thresholds can correspond to a capacitance value in a tunable capacitance circuit used to generate a VCO output. Each of the threshold values may be stored in the threshold lookup table 242 of FIG. 6, and Table 1 provides example threshold values. The size of the threshold lookup table 242 may be based on the number of threshold values stored times the number of bits used to store each threshold value. Thus, for more precise threshold values represented by more bits, the threshold lookup table 242 can be larger.

Each partition of a VCO gain correction curves C1-C3 can be represented by a linear VCO adjustment model. Since these models are linear, they can be represented by a slope and an intercept. A charge pump gain GN1-GN3 can represent the difference between a value computed by a VCO adjustment model and the corresponding intercept or offset. The slope can approximate the slope of the VCO gain correction curve for a particular partition. The slope for each VCO can be stored in the slope lookup table 244. The size of the slope lookup table 244 may based on the number of VCOs and the number of bits used to represent the value of the slope of each VCO. The intercept or offset can represent the point at which the VCO gain correction curve intersects the y-axis. The offset for each VCO can be stored in the offset lookup table 246. The size of the offset lookup table 246 may based on the number of VCOs and the number of bits used to represent the value of the slope of each VCO. In Table 1, example slope and offset values are provided corresponding to a VCO gain adjustment model for each of 6 VCOs. In another implementation, one offset for each VCO can be stored and the offsets corresponding to each VCO gain model can be derived from the stored offset.

The arithmetic logic unit 234 can read values from the lookup table component 232. The particular VCO gain adjustment model used to calculate a charge pump current control value can be determined by comparing a capacitance value of the tunable capacitance circuit that controls VCO output frequency to the threshold values in the threshold lookup table 242, for example, using one or more comparators 252. The capacitance value can be compared to any combination of the threshold values from the lookup table 242. From the comparison(s), a model select indicator can be generated. The slope and offset corresponding to each portion of each VCO gain correction curve can be read from the slope lookup table 244 and the offset lookup table 246, respectively. The values corresponding to the selected VCO can be selected, for example, using multiplexer(s) 254, based on an indicator from the VCO of which VCO is selected to generate the VCO output.

The model select indicator can be used to select the slope and offset corresponding to the selected VCO gain adjustment model can corresponds to VCO output frequency. A charge pump current correction value CHARGE PUMP CONTROL can be computed by multiplying a capacitance segment selection CAP_SEL by the selected slope SLP_VCO, for example, using multiplier 256. Then a selected offset OFS_VCO can be added, for example, using adder 257. The capacitance segment selection CAP_SEL can be obtained by comparing the current capacitance control with one or more of the threshold values. In some implementations, the capacitance segment selection CAP_SEL times the selected slope SLP_VCO can be divided by a predetermined multiple (e.g., 8) for scaling purposes and/or ease of computation. This could be implemented either before or after adding the selected offset. The division/scaling can be implemented with a divider 258. The divider 258 can shift a value by 3 bits, resulting in a division by 8. In such an implementation, the charge pump current control value can be represented by the following equation:

$$CP\_CTRL = \frac{SLP\_VCO \times CAP\_SEL}{8} + OFS\_VCO.$$

In some instances, a bypass function may pass a predetermined charge pump current control value instead of the charge pump current control value computed by the arithmetic logic unit 234. One way to implement the bypassing functionality to is to use multiplexer 262 to select the charge pump current control value calculated with the predetermined charge pump current control value using a bypass signal.

The VCO gain adjustment model parameters used for calculating a charge pump current control value may be derived using a number of different methods. The VCO gain adjustment model parameters may be obtained by a one time calibration, for example, during a factory calibration. Alternatively, the VCO gain model adjustment parameters may be auto-calibrated to account for additional variations.

Figure 8:
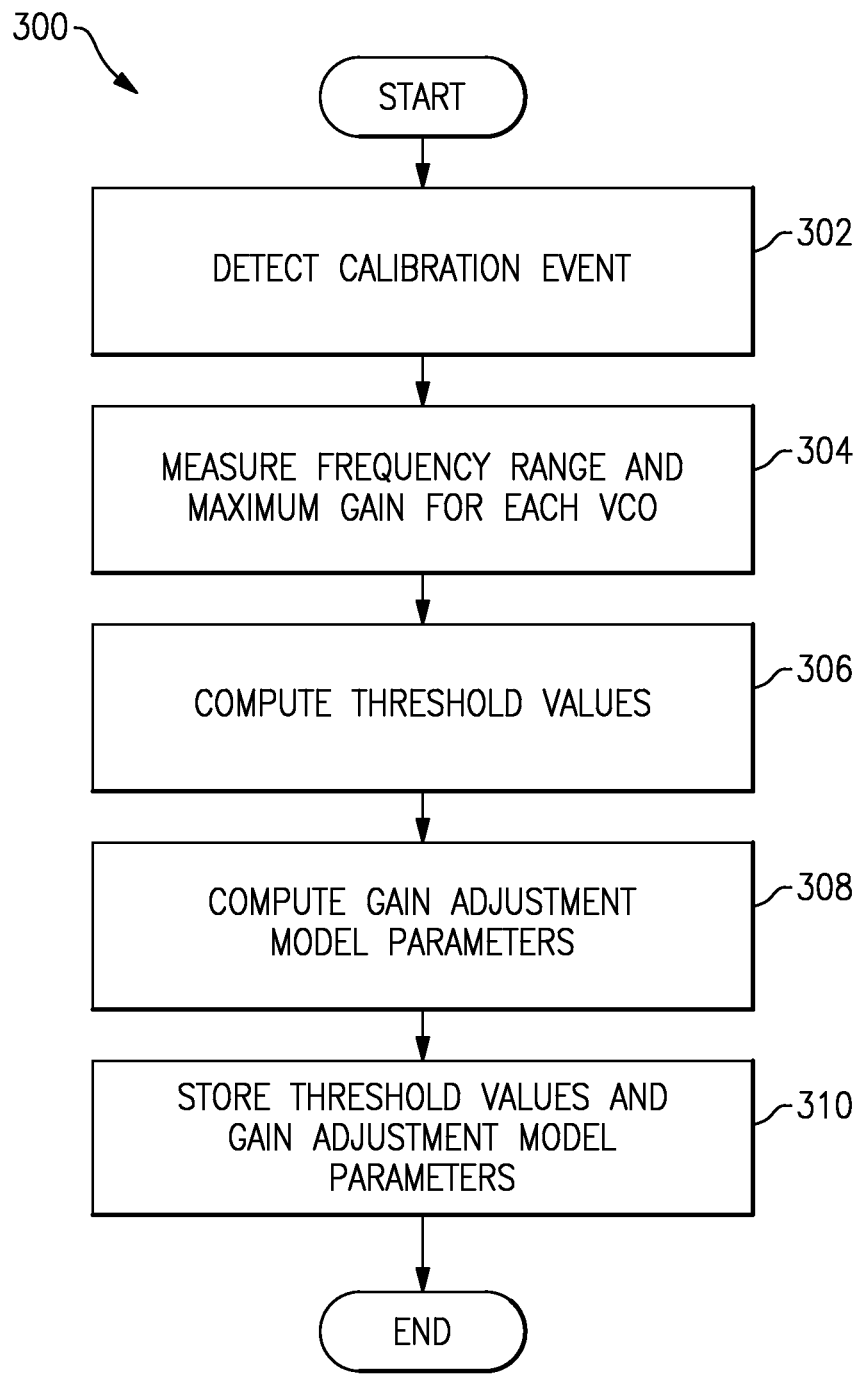
FIG. 8 is a flowchart of an illustrative method of calibrating VCO gain adjustment model parameters, according to an embodiment.

FIG. 8 is a flowchart of an illustrative method 300 of calibrating VCO gain adjustment model parameters, according to an embodiment. The method 300 can begin when a calibration event is detected at block 302. The calibration event is any event that can indicate that calibration can take place. For example, the calibration event can be powering-up a system that includes a VCO and a charge pump control. As another example, a calibration event can be when a part operates above a predetermined temperature for a predefined period of time. The calibration event can trigger a calibration finite state machine.

At block 304, a frequency range and maximum VCO gain can be determined for each VCO. For example, the calibration finite state machine can tune a tunable capacitance circuit used to generate VCO frequency over the range of tunable capacitances and measure the output frequency range and an indicator of VCO gain. The VCO frequency can be proportional to an effective capacitance in a tunable capacitance circuit used to generate a VCO output times a frequency of a reference clock provided to the phase-locked loop. The charge pump control current value range for each VCO can be proportional to the maximum VCO frequency divided by the minimum VCO frequency cubed. This process can be repeated for each individual VCO in systems that include more than one VCO. With VCO gain measurements over a variety of frequencies, a VCO gain versus frequency curve can be obtained for each VCO.

Once the VCO gain curve(s) have been obtained, the curve(s) can be divided into a plurality of sections that can be represented by piecewise linear models. One or more threshold values can be computed at block 306 to determine where to divide the curve(s) into linear models. This can include, for example, determining points on the curve(s) that can be used to divide the curve(s) into roughly linear sections. One non-limiting example way, among others, to calculate threshold values is based on determining a parasitic capacitance PAR_CAP and a charge pump step size $CP_{STEP}$. The following equations can be used for the example threshold value calculation:

$$PAR\_CAP = \frac{2^{CAP\_BITS} - 1}{(\max(CP_{RANGE}))^{\frac{2}{3}} - 1}$$

$$CP_{STEP} = \frac{(2^{CAP\_BITS} - 1 + PAR\_CAP)^{\frac{3}{2}} - (PAR\_CAP)^{\frac{3}{2}}}{NUM\_TH + 1}$$

$$TH[j] = \left(CP_{STEP} \cdot j + (PAR\_CAP)^{\frac{3}{2}}\right)^{\frac{2}{3}} - PAR\_CAP$$

In these equations, PAR_CAP can represent a parasitic capacitance of the VCO with the largest charge pump range, CAP_BITS can represent a number capacitance used for VCO tuning, $\max(CP_{RANGE})$ can represent a largest of all computed charge pump ranges, NUM_TH can represent a number of thresholds used to partition the VCO frequency range into segments, $CP_{STEP}$ can represent an incremental charge pump control step for each segment, and j can represent the j-th threshold value.

Gain adjustment model parameters can be computed at block 308. This can include, for example, deriving a slope and an intercept for each VCO gain adjustment. The slope and intercept of a curve can be derived using any of the methods well known in the art. For illustrative purposes, a non-limiting example of an equation for computing the slope SLP and the intercept OFS is provided. The following example equations can be used to derive the slope SLP and the intercept OFS:

$$SLP[i] = CP_{RANGE}[i] \cdot OFS[i] - OFS[i]$$

$$OFS[i] = \frac{KV_{MIN}[i]}{KV_{MIN}[\max]}$$

In these equations, SLP[i] can represent a slope of the i-th VCO gain adjustment model, $CP_{RANGE}[i]$ can represent the charge pump range covered between minimum and maximum frequency of the i-th VCO, OFS[i] can represent an intercept or offset of the i-th VCO gain adjustment model, $KV_{MIN}$ can represent a minimum VCO gain, and $KV_{MIN}[\max]$ can represent a minimum VCO gain of the VCO with the largest charge pump range.

At block 310, the threshold values and gain adjustment model parameters can be stored to memory. In some instances, these values can be stored to one or more lookup tables, for example, any of the lookup tables described in reference to FIG. 6. The threshold values and gain adjustment model parameters can later be read from memory and used to calculate a charge pump current control value, which can be used to compensate for VCO gain variations.

Some of the embodiments described earlier have provided examples in connection with mobile devices. However, the principles and advantages of the embodiments can be implemented in any other systems or apparatus that have a need for adjusting a gain of an electronic oscillator, such as a VCO. For example, any electronic device that includes a PLL may advantageously be improved by adjusting overall loop gain of phase-locked loop as described herein.

Such systems can in implemented in various electronic systems and/or electronic devices. Examples of electronic systems can include, but are not limited to, consumer electronic products, parts of consumer electronic products, electronic test equipment, etc. Examples of electronic devices can include, but are not limited to, a mobile phone (e.g., a smart phone), a telephone, a television, a computer monitor, a computer, a hand-held computer, a tablet computer, a personal digital assistant (PDA), a microwave, a refrigerator, an automobile, a stereo system, a DVD recorder and/or player, a CD recorder and/or player, a VCR, an MP3 player, a radio, a camcorder, a camera (e.g., a digital camera), a portable memory chip, a washer, a dryer, a copier, a facsimile machine, a scanner, a multi-function peripheral device, a wrist watch, a clock, etc. Further the electronic devices and/or electronic systems can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of certain embodiments is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A frequency synthesizer comprising:
a plurality of voltage-controlled oscillators (VCOs) of which a selected VCO provides a VCO output to a closed loop of a phase-locked loop;
a charge pump configured to adjust a loop gain of the phase-locked loop based on a charge pump current control value; and
a charge pump controller configured to select a VCO gain adjustment model corresponding to the selected VCO based on a VCO gain indicator, the VCO gain adjustment model representing a segment of a piecewise linear representation of a VCO correction curve associated with the selected VCO, the charge pump controller further configured to obtain, from a memory, VCO gain model parameters corresponding to the selected VCO gain adjustment model and to adjust the charge pump current control value based on the VCO gain model parameters to thereby cause the loop gain of the phase-locked loop to be adjusted.

2. The frequency synthesizer of claim 1 wherein the VCO gain model parameters include a slope and an offset.

3. The frequency synthesizer of claim 1 wherein the charge pump controller is configured to select the segment of the piecewise linear representation of the VCO correction curve based on comparing the VCO gain indicator with a threshold value.

4. The frequency synthesizer of claim 1 wherein the charge pump is configured to dynamically compensate for VCO gain variations by adjusting the charge pump current control value.

5. An apparatus comprising:
a memory configured to store gain adjustment model parameters including slopes and offsets corresponding to frequency ranges of an electronic oscillator; and
an arithmetic logic unit configured to select a slope and an offset of the gain adjustment model parameters stored in the memory based on an indicator of output frequency of the electronic oscillator and to cause a charge pump to adjust a gain of a phase-locked loop based on the selected slope and the selected offset.

6. The apparatus of claim 5 wherein the electronic oscillator is a voltage-controlled oscillator (VCO).

7. The apparatus of claim 6 wherein the memory is configured to store gain adjustment model parameters including slopes and offsets corresponding to frequency ranges of a plurality of VCOs.

8. The apparatus of claim 7 wherein the arithmetic unit is configured to select the slope and the offset for one VCO of the plurality of VCOs configured to provide a VCO output to a closed loop of the phase-locked loop.

9. The apparatus of claim 5 wherein the arithmetic unit is configured to compute a charge pump current control value based on the selected slope and the selected offset.

10. The apparatus of claim 9 wherein the arithmetic unit is further configured to output a predetermined charge pump current control value in place of the charge pump current control value computed by the arithmetic logic unit.

11. The apparatus of claim 5 wherein the arithmetic unit is configured to select the slope and the offset based on comparing the indicator of frequency with a threshold value stored in the memory.

12. The apparatus of claim 5 wherein the memory is a lookup table.

13. An apparatus comprising a charge pump controller configured to select a slope and an offset associated with a selected voltage-controlled oscillator (VCO) of a plurality of VCOs each configured to generate an output within a different frequency band than the other of the plurality of VCOs, the selected VCO configured to provide a VCO output to a closed loop of a phase-locked loop, a VCO gain correction curve for the selected VCO being divided into a plurality of piecewise linear gain adjustment models, one of the piecewise linear gain adjustment models including the slope and the offset selected by the charge pump controller, and the charge pump current controller further configured to compute a charge pump control value based on the selected slope and the selected offset to cause a loop gain of the phase-locked loop to be adjusted.

14. The apparatus of claim 13 further comprising the plurality of VCOs and a charge pump configured to adjust the loop gain of the phase-locked loop based on the charge pump control value computed by the charge pump controller.

15. The apparatus of claim 14 wherein the output of each of the plurality of VCOs is within a frequency band that overlaps with a frequency band of another of the plurality of VCOs.

16. The apparatus of claim 14 further comprising a phase-locked loop divider configured to receive the VCO output from the selected VCO of the plurality of VCOs.

17. The apparatus of claim 14 wherein the charge pump is configured to dynamically compensate for VCO gain variations based on the charge pump control value.

18. The apparatus of claim 13 wherein the charge pump controller is configured to select the slope and the offset associated with the selected VCO based on a comparison with a threshold value.

19. The apparatus of claim 18 wherein the comparison includes comparing the threshold value with a capacitance value associated with the selected VCO.

20. The apparatus of claim 13 wherein the charge pump controller includes a memory configured to store the selected slope and the selected offset.

* * * * *